(12) United States Patent
Tanaka et al.

(10) Patent No.: US 11,676,681 B2
(45) Date of Patent: Jun. 13, 2023

(54) SEMICONDUCTOR DEVICE

(71) Applicant: RENESAS ELECTRONICS CORPORATION, Tokyo (JP)

(72) Inventors: Shinji Tanaka, Tokyo (JP); Yuichiro Ishii, Tokyo (JP); Makoto Yabuuchi, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 33 days.

(21) Appl. No.: 17/382,923

(22) Filed: Jul. 22, 2021

(65) Prior Publication Data

US 2022/0036961 A1 Feb. 3, 2022

(30) Foreign Application Priority Data

Jul. 30, 2020 (JP) .............................. JP2020-128971

(51) Int. Cl.
*G11C 11/419* (2006.01)
*G11C 29/50* (2006.01)
*G11C 5/06* (2006.01)

(52) U.S. Cl.
CPC .............. *G11C 29/50* (2013.01); *G11C 5/063* (2013.01); *G11C 11/419* (2013.01); *G11C 2029/5004* (2013.01)

(58) Field of Classification Search
CPC ..................................................... G11C 29/50
See application file for complete search history.

(56) References Cited

U.S. PATENT DOCUMENTS

| 5,339,273 | A | 8/1994 | Taguchi | |
| 2002/0036918 | A1* | 3/2002 | Hidaka | H01L 27/228 257/E27.005 |
| 2004/0047171 | A1* | 3/2004 | Roehr | G11C 29/50 365/89 |
| 2005/0278594 | A1 | 12/2005 | Hirabayashi | |
| 2013/0135940 | A1 | 5/2013 | Mori et al. | |
| 2015/0279454 | A1* | 10/2015 | Sano | G11C 11/419 365/189.09 |

(Continued)

FOREIGN PATENT DOCUMENTS

JP 03-154289 A 7/1991
JP 2006-331511 A 12/2006

OTHER PUBLICATIONS

Extended European Search Report issued in corresponding European Patent Application No. 21186350.1-1203, dated Dec. 2, 2021.

*Primary Examiner* — Min Huang
(74) *Attorney, Agent, or Firm* — McDermott Will & Emery LLP

(57) ABSTRACT

A semiconductor device including an SRAM capable of sensing a defective memory cell that does not satisfy desired characteristics is provided. The semiconductor device includes a memory cell, a bit line pair being coupled to the memory cell and having a voltage changed towards a power-supply voltage and a ground voltage in accordance with data of the memory cell in a read mode, and a specifying circuit for specifying a bit line out of the bit line pair. In the semiconductor device, a wiring capacitance is coupled to the bit line specified by the specifying circuit and a voltage of the specified bit line is set to a voltage between a power voltage and a ground voltage in a test mode.

7 Claims, 12 Drawing Sheets

(56) References Cited

U.S. PATENT DOCUMENTS

2015/0325313 A1* 11/2015 Badereddine .......... G11C 29/50
  365/154
2018/0240513 A1  8/2018 Sano et al.
2018/0315465 A1* 11/2018 Yamada .............. G11C 11/2273

* cited by examiner

| NAME | PURPOSE | CONFIGURATION | SPEED |
|---|---|---|---|
| 2S1 | L1 CACHE | 512word x 64bit(cpb4) | 1GHz |
| 2S2 | L2 CACHE | 4096word x 32bit(cpb8) | 500MHz |
| 3S1 | IMAGE DATA STORAGE | 2048word x 128bit(cpb4) | 333MHz |
| 4S1 | COMMUNICATON CONTROL DATA | 128word x 32bit(cpb8) | 250MHz |
| 5S1 | GENERIC DATA | 1024word x 32bit(cpb8) | 333MHz |

| BIAS MODE | BOOST | BOOST_Node | BIAS_Node |
|---|---|---|---|
| 0 | 0 | Vdd | Vss |
| 0 | 1 | Vss | NEGATIVE POTENTIAL |
| 1 | 0 | Vss | Vss |
| 1 | 1 | Vdd | INTERMEDIATE POTENTIAL |

FIG. 16

| BIAS MODE | BOOST | BOOST_Node | BIAS_Node |
|---|---|---|---|
| 0 | 0 | Vdd | Vss |
| 0 | 1 | Vss | NEGATIVE POTENTIAL |
| 1 | 0 | Vdd | Vdd |
| 1 | 1 | Vss | INTERMEDIATE POTENTIAL |

SEMICONDUCTOR DEVICE

CROSS-REFERENCE TO RELATED APPLICATIONS

The disclosure of Japanese Patent Application No. 2020-128971 filed on Jul. 30, 2020, including the specification, drawings and abstract hereby incorporated by reference in its entirety.

BACKGROUND

The present invention relates to a semiconductor device and particularly relates to a semiconductor device including a static random access memory.

There are disclosed techniques listed below.
[Patent Document 1] Japanese Unexamined Patent Application Publication No. H3-154289.

As a semiconductor device, Patent Document 1 discloses a semiconductor memory device. Patent Document 1 discloses a semiconductor memory device capable of testing an operation margin of a memory cell. To be more exact, Patent Document 1 discloses a technique of detecting a memory cell with a small operation margin and so forth by coupling a fixed capacitance or testing in which charges are accumulated beforehand upon reading in a test mode to make it less capable of detecting a potential difference that occurs between bit lines in accordance with charge redistribution.

SUMMARY

In an SRAM, to read data from a memory cell, in an initial state, for example, pre-charging is performed to a bit line pair (pair of bit lines) to which a memory cell is coupled. When a memory cell is selected, in accordance with data stored in the memory cell, read current flows in the memory cell and then a potential of one bit line of the bit line pair is lowered. At this moment, the other bit line is regarded as a reference bit line and a potential difference between the one bit line and the reference bit line is amplified to read the data of the selected memory cell.

To detect a memory cell having a small operation margin, in other words, a memory cell that does not satisfy desired characteristics, the fixed capacitance for testing is coupled to the reference bit line according to the technique Patent Document 1 discloses. In this manner, charge redistribution is performed between the fixed capacitance for testing and a capacitance of the reference bit line so that lowering of the potential of the reference bit line is enabled. As a result, it becomes possible to make a potential difference between bit lines of the bit line pair upon lowering of a potential of the one of the bit lines by the selected memory cell so that it is possible to make it less capable of reading data from the selected memory cell. Since a read current becomes smaller when a memory cell that does not satisfy desired characteristics is selected, for example, a time period until a potential difference between bit lines of a bit line pair reaches a predetermined value becomes longer so that it becomes possible to detect a memory having a small operation margin.

In this manner, according to the study by the inventors of present invention, it is possible to detect a memory cell having a small operation margin also when diverting the technique disclosed in Patent Document 1 for SRAM.

However, according to the study by the inventors of present invention, a problem is revealed in the technique disclosed in Patent Document 1 for example in the SRAM (compiled SRAM) configured by using, for example, a compiled SRAM technique.

In other words, in the technique according to Patent Document 1, since the fixed capacitance is coupled to the bit line, it is effective in DRAM and so forth because it is possible to make a potential of the bit line that is lowered by charge redistribution approximately constant as long as a length of the bit line is always constant.

On the contrary, in the compiled SRAM technique, a length of a bit line or/and word line is variable for example. Therefore, when the same fixed capacitance is coupled among a plurality of SRAMs having different bit line lengths for example, in some SRAMs, an excess amount of charge may be accumulated in the fixed capacitance and a desired amount of charges may not accumulated on the contrary. As a result, it is thought that the potential of bit line is largely lowered and not lowered by a desired amount on the contrary according to charge redistribution. In this manner, for example, even when the memory cell satisfies desired characteristics, there is a possibility of detecting it is a memory cell having a small operation margin.

A semiconductor device according to an embodiment is described below.

The semiconductor device includes a memory cell, a bit line pair changing towards a first voltage and a second voltage that is different from the first voltage in accordance with data of the memory cell in a read mode and a specifying circuit for specifying a bit line from the bit line pair. Here, in a test mode, a capacitative element is coupled to the bit line specified by the specifying circuit to set a voltage of the specified bit line at a potential between the first voltage and the second voltage.

Other problems and novel characteristics will be apparent rom the descriptions in the present specification and attached drawings.

According to an embodiment, it is possible to provide a semiconductor device including an SRAM capable of detecting a defective memory cell not having desired characteristics.

BRIEF DESCRIPTION OF THE DRAWINGS

FIG. 16 is a diagram illustrating an operation of an intermediate potential generating circuit according to the second embodiment.

DETAILED DESCRIPTION

Figures 1, 2:
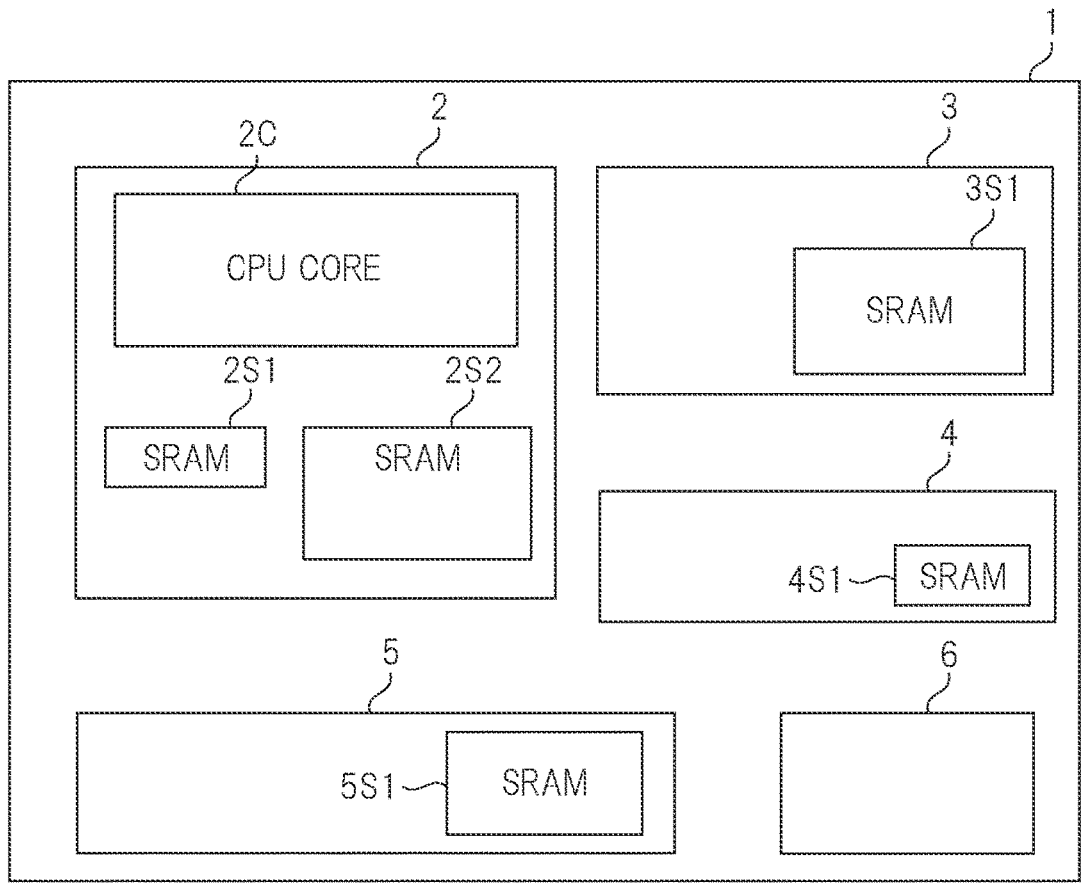
FIG. 1 is a block diagram illustrating a configuration of a semiconductor device according to a first embodiment.
FIG. 2 is a diagram illustrating an example of specifications of an SRAM according to the first embodiment.

Hereinafter, respective embodiments of the present invention will be described with reference to the drawings. Note that the disclosure is only one example and any modification as needed while maintaining the scope of the invention which a person skilled in the art may easily think of is of course included. In addition, to make the description more clearly, while width, number, shape and so forth may be schematically described in the drawings as compared to an actual embodiment, it is only one example and interpretation of the present invention is not limited.

In addition, in the present specification and respective drawings, the same components described in aforementioned diagram are denoted by the same reference symbols and detailed descriptions thereof may be suitably omitted.

Hereafter, an embodiment will be described exemplifying a semiconductor device having a plurality of SRAMs. Here, the plurality of SRAMs are configured according to a compiled SRAM technique.

First Embodiment

Configuration of Semiconductor Device

FIG. 1 is a block diagram illustrating a configuration of a semiconductor device according to the first embodiment. In FIG. 1, the number "1" denotes the semiconductor device. Although not particularly limited, a plurality of circuit blocks are formed in one semiconductor chip according to known semiconductor device manufacturing techniques to configure the semiconductor device 1. While the plurality of circuit blocks are formed in the semiconductor device 1, in FIG. 1, only some circuit blocks necessary for the description are illustrated not to make the drawings complicated.

In FIG. 1, as the circuit blocks included in the semiconductor device 1, a processor (CPU) block 2, an image processing block 3, an external interface (I/F) block 4, a system control block 5, and a test (DFT: design for test) control block (DFT control circuit) 6 are illustrated.

The CPU block 2 includes a CPU core 2C and SRAMs 2S1 and 2S2. The CPU core 2C uses, upon executing a program for example, the SRAM 2S1 as a primary (L1) cache and the SRAM 2S2 as a secondary (L2) cache. The SRAM 2S1 used as primary cache is a high-speed SRAM although its storage capacity is small. On the contrary, the SRAM 2S2 used as a secondary cache is a mid-speed SRAM having a middle storage capacity. That is, the SRAM 2S2 has a larger memory capacity and a slower speed than these of the SRAM 2S1.

The image processing block 3 is a functional block for performing an image processing and includes an SRAM 3S1 to use upon processing. The system control block 5 for controlling system composed of the external interface (I/O) block that provides an interface between the external and internal of the semiconductor device 1 and the semiconductor device 1 also includes an SRAM 4S1 and an SRAM 5S1 used upon processing in the same manner as the image processing block 3.

The DFT control block 6 is a test control block configured by test facilitating technique. The DFT control block 6 outputs signals and data for testing upon testing the SRAMs 2S1 to 5S1 which will be described with reference to the drawings hereinafter.

The SRAMs 2S1 to 5S1 are compiled SRAMs. That is, the SRAMs 2S1 to 5S1 are configured to be most suitable to a processing executed by the respective circuit blocks (CPU block 2, image processing block 3, external I/F block 4, and system control block 5) according to a compiled SRAM technique. Although not limited, one example of specifications of the SRAMs 2S1 to 5S1 is illustrated in FIG. 2. When a configuration of a compiled memory is illustrated, idiomatically, "word" denotes a number of memory cells coupled to one IO, bit denotes a number of IOs, and cpb denotes a number of bit line pairs coupled to one IO. A number of word lines is determined by dividing word by cpb and a number of bit line pairs is determined by multiplying bit and cpb. As illustrated in FIG. 2, for example, SRAM 2S1 is configured by 512-word by 64-bit in which the operation speed is 1 GHz and SRAM 2S2 is configured by 4096-word by 32-bit has an operation speed at 500 MHz.

Each of the SRAMs 2S1 to 5S1 includes a memory array configured by a plurality of word lines arranged at each line and a plurality of bit line pairs arranged at each column. To be described hereinafter with reference to the drawings, an example of memory array is summarized exemplifying the SRAMs 2S1 and 2S2. The SRAM 2S1 is configured by 64 IO circuits having 512 memory cells, the memory array has 128 word lines and 256 pairs of bit line pairs, and 128 memory cells are coupled to each bit line pair. On the contrary, the SRAM 2S2 is configured by 32 IO circuits that includes 4096 memory cells, the memory array includes 512 word lines and 256 bit line pairs, and 512 memory cells are coupled to each bit line pair. As the numbers of coupled memory cells are different, a length of the bit line pair and a length of the word line are different in the SRAM 2S1 and the SRAM 2S2. In this manner, by using the compiled SRAM technique, SRAMs fitting needs of parts to be used are mounted.

Configuration of SRAM

Next, configurations of the SRAMs 2S1 to 5S1 will be described with reference to the drawings. As it is understood from the description above, although the lengths of the bit line pair and the word line differ in the SRAMs 2S1 to 5S1, their basic configurations are in the same manner among the SRAM 2S1 to 5S1. Therefore, hereinafter, one of the SRAMs (for example, the SRAM 2S1) will be described as an example.

Figure 3:
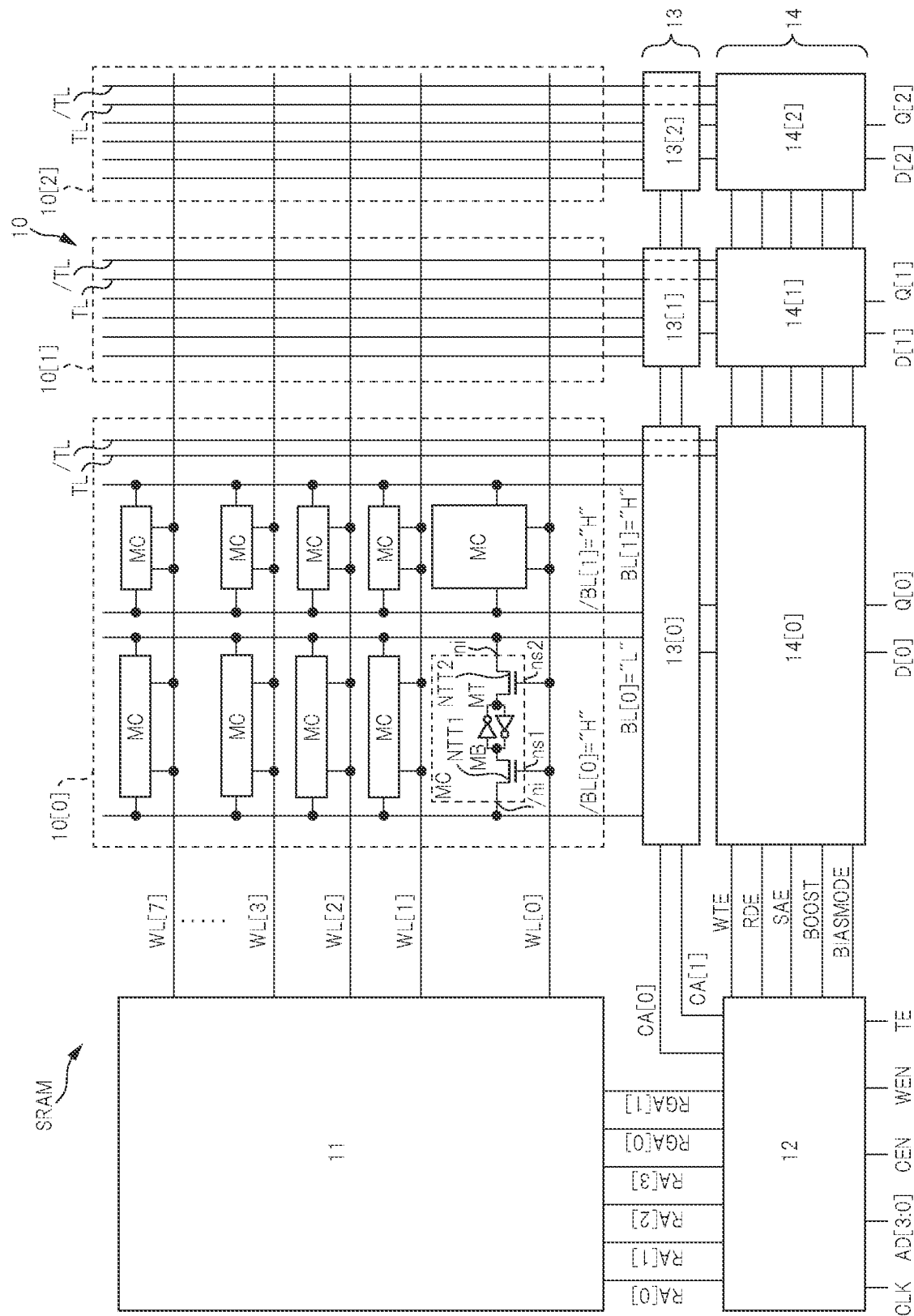
FIG. 3 is a block diagram illustrating a configuration of the SRAM according to the first embodiment.

FIG. 3 is a block diagram illustrating a configuration of the SRAM according to first embodiment.

The SRAM includes a memory array 10, a row selection circuit 11, a control circuit 12, a column select circuit 13, and an input/output (IO) control circuit 14. FIG. 3 illustrates that a plurality of input data items or a plurality of output data items are input to and output from other circuit blocks in the semiconductor device 1 (FIG. 1) substantially at the same time.

To the SRAM, from the other circuit blocks formed in the semiconductor device 1 (FIG. 1), a clock signal CLK, an address signal AD[3:0], an enable signal CEN, a write enable signal WEN and a test enable signal TE are supplied. The clock signal CLK is a synchronized clock, and the SRAM is operated in synchronization with the clock signal CLK. In addition, the SRAM is set to an enable state by the enable signal CEN and when a write mode is set to the SRAM by the write enable signal WEN input data D[0] to D[2] is supplied from other circuit blocks to perform writing. On the other hand, when a read mode is set to the SRAM by the write enable signal WEN, data is read from the SRAM and supplied as output data Q[0] to Q[2] to the other circuit blocks.

To the control circuit 12, the clock signal CLK, the address signal AD[3:0], the enable signal CEN, the write enable signal WEN and the test enable signal TE are supplied, and the control circuit 12 forms a plurality of signals based on these signals. Note that the symbol [3:0] in the address signal AD indicates that the address signal AD is configured by four bits (address signals AD[0] to AD[3]).

Among the signals formed by the control circuit 12, column address signals RA[0] to RA[3] and control signals RGA[0] and RGA[1] are supplied to the column select circuit 11. In addition, the column address signals CA[0] to CA[1] formed by the control signal 12 are supplied to the column select circuit 13. Further, a write control signal WTE, a read control signal RDE, a sense amplifier control circuit signal SAE, a boost control signal BOOST, and a bias mode control signal BIASMODE are formed by the control circuit 12 and supplied to the IO control circuit 14. One example of configuration of the control circuit 12 will be described in detail later with reference to the drawings, and detailed descriptions will be thus omitted here.

The column select circuit 11 is coupled to the word lines WL[0] to WL[7] arranged in the memory array 10. Although an example of the column select circuit 11 will be described with reference to the drawings, the column select circuit 11 selects a word line specified by the address signal RA[0] to RA[3] from the word lines WL[0] to WL[7] arranged in the memory array 10 based on the column address signals RA[0] to RA[3] and the control signals RGA[0] to RGA[1].

The column select circuit 13 is coupled to a plurality of bit lines arranged in the memory array 10 and selects a bit line pair specified by the column address signals CA[0] to CA[1].

To the IO control circuit 14, the bit line pair selected by the column select circuit 13 is coupled. To the IO control circuit 14, the write control signal WTE, the read control signal RDE, the sense amplifier control circuit signal SAE, the boost control signal BOOST and the bias mode control signal BIASMODE are supplied and the IO control circuit 14 inputs input data D[0] to D[2] and outputs output data Q[0] to Q[2].

The memory array 10 includes a plurality of memory cells MC arranged in matrix, a plurality of word lines WL[0] to WL[7] arranged in each row of the matrix, and a plurality of bit line pairs BL[0], /BL[0] to BL[1], BL[1] arranged in each column of the matrix.

The memory cell MC includes two inverters coupled in cross-connection manner to configure a latch circuit and transfer transistors NTT1 and NTT2 coupled between an input/output unit and data input/output terminals /ni, ni of the latch circuit. In the first embodiment, as the transistor, a field-effect transistor (MOSFET) is used. Gate electrodes of the transfer transistors NTT1 and NTT2 are coupled to the word line arranged in the row in which the memory cell is arranged, and the data input/output terminals /ni and ni of the memory cell are coupled to the bit line pair arranged in the column in which the memory cell is arranged.

In the first embodiment, wiring pair TL and /TL are arranged in the memory array 10.e The wiring pair TL and /TL are arranged in parallel with the bit line pair BL and /BL and extended in the same direction as the bit line pair BL and /BL in the memory array 10. In addition, a length of the wiring pair TL and /TL is substantially the same as that of the bit line pair BL and /BL. Further, one terminal part of the wiring pair TL and /TL is coupled to the IO control circuit 14. In the first embodiment, the wiring pair TL and /TL is formed on a semiconductor chip via an insulator and also an insulator is provided via the wiring TL and the wiring /TL so that the wiring (the other wiring) TL and the wiring (one of the wirings) are electrically separated. Although not particularly limited, the wiring pair TL and /TL is formed of metal wirings formed on the semiconductor chip via the insulator.

In the first embodiment, the memory array 10, the column select circuit 13 and the IO control circuit 14 are configured by a plurality of unit memory arrays corresponding to input data and output data, a plurality of unit column select circuits and a plurality of unit IO control circuits. In the example illustrated in FIG. 3, the memory array 10 is configured by three unit memory arrays 10[0] to 10[2], the column select circuit 13 is configured by three unit select circuits 13[0] to 13[2], and the IO control circuit 14 is configured by three unit IO control circuits 14[0] to 14[2]. In addition, the aforementioned wiring pair TL and /TL is arranged in each unit memory array and coupled to corresponding unit IO control circuit.

Since each of the unit memory array, unit column select circuit and unit IO control circuit has the same configuration to each other, in the following, the unit memory array 10[0], the unit column select circuit 13[0] and the unit IO control circuit 14[0] corresponding to the input data D[0] and output data Q[0] will be described as representative elements.

Figure 4:
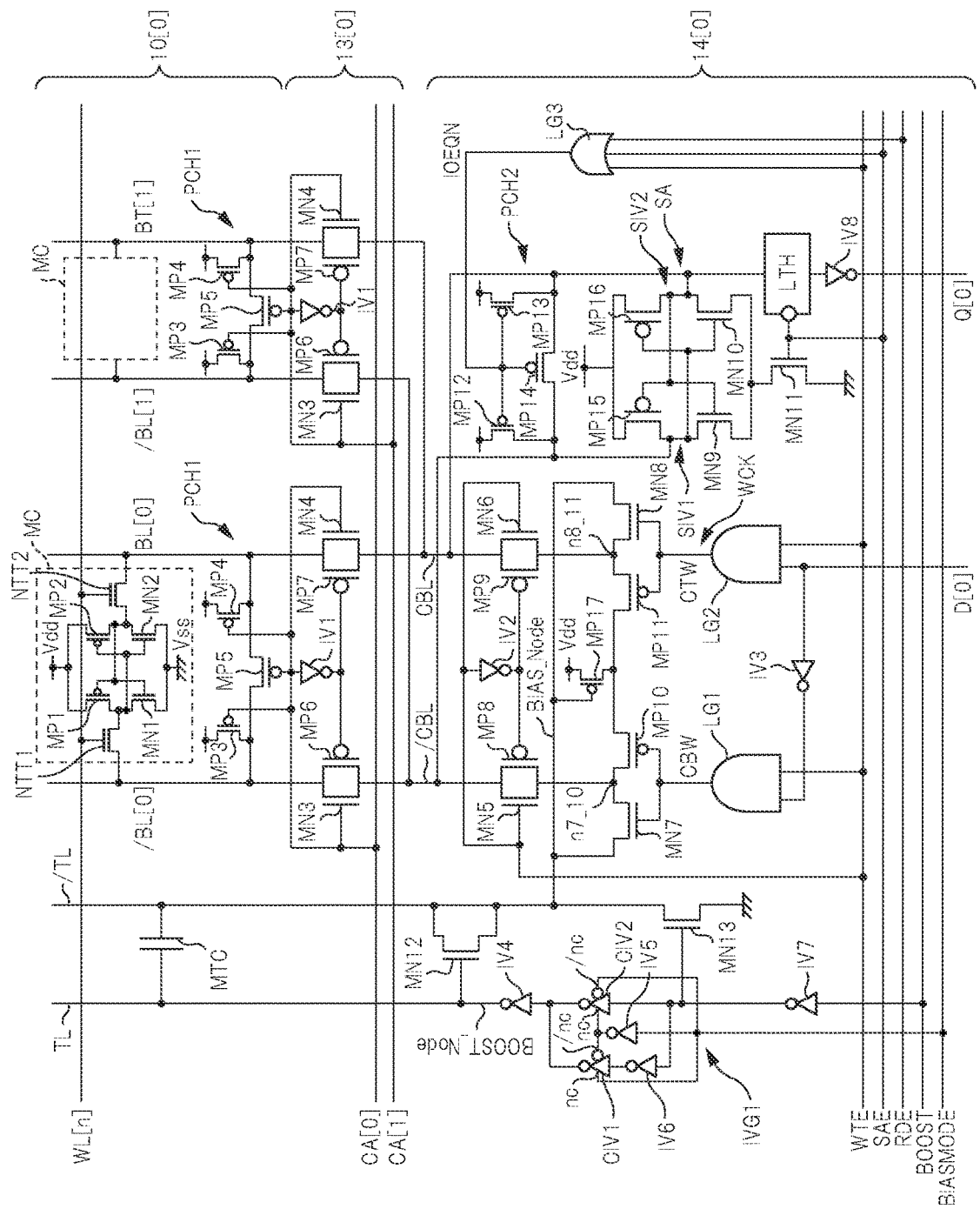
FIG. 4 is a circuit diagram illustrating a configuration of a unit memory array, a unit column select circuit and a unit IO control circuit according to the first embodiment.

Circuit Configuration Next, configurations of the unit memory array 10[0], the unit column select circuit 13[0] and the unit IO control circuit 14[0] will be described with reference to the drawings. FIG. 4 is a circuit diagram illustrating a configuration of the unit memory array, the unit column select circuit and the unit IO control circuit according to the first embodiment.

Unit Memory Array and Unit Column Select Circuit

In FIG. 3, WL[0] to WL[7] are illustrated as word lines. On the contrary, one word line WL[n] is illustrated as a representative in FIG. 4. In addition, although the latch circuit inside the memory cell MC is illustrated by a cross-connection inverter in FIG. 3, P-channel type MOSFETs (hereinafter, P-type FETs) MP1 and MP2 and N-channel type MOSFETs (hereinafter, N-type FETs) MN1 and MN2 configurating an inverter are shown in FIG. 4. In other words, the P-type FET MP1 (MP2) and the N-type FET MN1 (MN2) configure the inverter by coupling them between a power voltage (first voltage) Vdd and a ground voltage (second voltage) Vss in series.

To select the memory cell MC, the word line WL[n] is at a high level (power voltage Vdd) and to unselect the memory cell MC, the word line WL[n] is at a low level (ground voltage Vss). In the same manner, to select a bit line pair, the volume address signal CA[0] or CA[1] is at a high level, and to unselect the bit line pair, the column address signal CA[0] or/and CA[1] is at a low level.

To the bit lines of the bit line pair BL[0] and /BL[0] which are in a complementarity relation, a pre-charge circuit PCH1 is coupled. In FIG. 4, the pre-charge circuit PCH1 includes P-type FETs MP3 and MP4 coupled between the bit line pair BL[0] and /BL[0] and a P-type FET MP5 coupled between the bit lines of the bit line pair BL [0] and /BL [0]. In the SRAM according to the first embodiment, when the bit line pair is unselected, the bit line pair is pre-charged.

When the bit line pair BL[0] and /BL[0] is unselected, the column address signal CA[0] is at a low level. Thus, the P-type FETs MP3 and MP4 are in an on state, so that the bit line pair BL[0] and /BL[0] is pre-charged to the power voltage Vdd. In addition, at this moment, the bit line BL[0] and the bit line /BL[0] are short-circuited by the P-type FET MP5, so that a potential difference between the bit lines of the bit line pair BL[0] and /BL[0] is reduced. Note that, in FIG. 4, while the pre-charge circuit PCH1 is illustrated like it is arranged in the unit memory array 10[0], it is not limited to this manner and the pre-charge circuit PCH1 may be arranged in the unit select circuit [0].

The unit column select circuit 13[0] includes a common bit line pair CBL and /CBL which is in common among a plurality of bit line pairs, N-type FETs MN3 and MN4 and P-type FETs MP6 and MP7 coupled between the bit line pair BL[0] and /BL[0] and the bit line pair BL[1] and /BL[1], and an inverter IV1. To exemplify the bit line pair BL[0] and /BL[0], a source-drain path of the N-type FET MN3 and the P-type FET MP6 is coupled in series between the bit line /BL[0] and the common bit line CBL. In the same manner, a source-drain path of the N-type FET 4 and the P-type FET MP7 is coupled in series between the bit line BL[0] and the common bit line CBL. To select the bit line pair BL[0] and /BL[0], by setting the column address signal CA[0] at a high level, the N-type FETs MN3 and MN4 and the P-type FETs MP6 and MP7 are in an on state, so that the bit line pair BL[0] and /BL[0] and the common bit line pair CBL[0] and /CBL[0] are electrically coupled. Note that, when the bit line pair BL[0] and /BL[0] are unselected, the N-type FETs MN3 and MN4 and the P-type FETs MP6 and MP7 are in an off state, so that the bit line pair BL[0] and /BL[0] and the common bit line pair CBL[0] and /CBL[0] are electrically separated.

Unit IO Control Circuit

The unit IO control circuit 13[0] includes a pre-charge circuit PCH2, a sense amplifier SA, a write circuit WCK, and an intermediate potential generating circuit IVG1.

Pre-charge circuit PCH2 I configured by P-type FETs MP12 to MP14 and coupled between the common bit line pair CBL and /CBL and the power voltage Vdd. Here, the P-type FET MP12 and MP13 are coupled between the power voltage Vdd and the common bit line pair /CBL and CBL, and the P-type FET MP14 is coupled between the bit lines of the common bit line pair /CBL and CBL. The P-type FETs MP12 to MP14 are controlled by an output of an OR circuit LG3. To the OR circuit LG3, the write control signal WTE, the sense amplifier control signal SAE and a read control signal RDE are supplied. In this manner, the P-type FETs MP12 to MP14 are in an off state in a read mode for reading data from a selected memory cell, a write mode for writing data to a selected memory cell, and a test mode for performing testing of a memory cell. In other cases, the P-type FETs MP12 to MP14 are in an on state in which the common bit line pair /CBL and CBL are pre-charged to the power voltage Vdd and a potential difference between the bit lines of the bit line pair is reduced at the same time.

The sense amplifier SA includes P-type FETs MP15 and MP16, N-type FET MN9 to MN11, a latch circuit LTH, and an inverter IV8. An inverter SIV1 is configured by the P-type FET MP15 and the N-type FET MN9, and an inverter SIV2 is configured by the P-type FET MP16 and the N-type FET MN10. The inverters SIV1 and SIV2 are coupled in a cross-connection manner. In other words, an input of the inverter SIV1 is coupled to an output of the inverter SIV2 and an input of the inverter SIV2 is coupled to an output of the inverter SIV1.

In addition, the input of the inverter SIV1 is coupled to the common bit line CBL and the input of the SIV2 is coupled to the common bit line /CBL. Further, sources of the P-type FETs MP15 and MP16 are coupled to the power voltage Vdd and sources of the N-type FETs MN9 and MN10 are coupled to the ground voltage Vss via the N-type FET MN11 that is controlled by the sense amplifier control signal SAE. The latch circuit LTH is coupled to the common bit line CBL and controlled by the sense amplifier control signal SAE. In addition, an output of the latch circuit LTH is outputted as the output data Q[0] via the inverter IV8.

By setting the sense amplifier control signal SAE at a high level, the cross-connected inverters SIV1 and SIV2 operates to amplify a potential difference between the bit lines of the common bit line pair CBL and /CBL. The latch circuit LTH latches an amplified voltage of the common bit line CBL as a logic value. In this manner, a logic value latched by the latch circuit LTH is logic-inverted by the inverter IV8 and outputted as the output data Q[0].

The write circuit WCK includes an AND circuit LG2 to which the input data D[0] and the write control circuit WTE are supplied, an AND circuit LG1 to which the input data D[0] inverted by the inverter IV3 and the write control signal WTE are suppled, the inverter IV2, the N-type FETs MN5 to MN8, and the P-type FETs MP8 to MP11 and a P-type FET MP17.

The N-type FET MN7 and the P-type FET MP10 are coupled in series between a bias node BIAS_Node and the power voltage Vdd via the P-type FET MP17. a connection node n7_10 between the N-type FET MN7 and the P-type FET MP10 is coupled to the common bit line /CBL via the N-type FET MN5 and the P-type FET MP8. In the same manner, also the N-type FET MN8 and the P-type FET MP11 are coupled in series between the bias node BIAS Node and the power voltage Vdd via the P-type FET MP17. a connection node n8_11 between the N-type FET MN8 and the P-type FET MP11 is coupled to the common bit line CBL via the N-type FET MN6 and the P-type FET MP9.

The write control signal WTE is suppled to gates of the N-type FETs MN5 and MN6. The write control signal WTE is logic-inverted by the inverter IV2. The inverted write control signal WTE is supplied to gates of the P-type FET MP8 and MP9. The N-type FET MN5 (MN6) and the P-type FET MP10 (MP11) are coupled so that their source-drain paths are in parallel. Thus, the N-type FET MN5 (MN6) and the P-type FET MP10 (MP11) function as a transfer gate circuit which selectively couples the common bit line pair CBL and /CBL to the connection nodes n7_10 and n8_11 in accordance with the write control signal WTE. In other words, as the write control signal WTE is set at a high level, the transfer gate electrically couples the common bit line pair CBL and /CBL to the connection nodes n7_10 and n8_11.

To the gates of the N-type FET MN7 and the P-type FET MP10, the output signal CBW from the AND circuit LG1 is supplied. To the gates of the N-type FET MN8 and the P-type FET MP11, the output signal CTW from the AND circuit LG2 is supplied. In this manner, when the write control signal WTE is at a high level, in accordance with a logic value of the input data D[0], the N-type FET MN7 or the P-type FET MP10 is turned into an on state, so that the common bit line /CBL is electrically coupled to the power voltage Vdd via the bias node BIAS_Node or the P-type FET MP17. In the same manner, in accordance with a logic value of the input data D[0], the N-type FET MN8 or the P-type FET MP1/ is turned into an on state, so that the common bit line CBL is also electrically coupled to the power voltage Vdd via the bias node BIAS_Node or the P-type FET MP17.

In the write mode and the test mode, the output signal CTW has the same logic value with that of the input data D[0] and the output signal CBW has an inverted logic value to the input data D[0]. In addition, the P-type FET MP17 is controlled to be on state or off state in accordance with a potential of the bias node BIAS_Node. As described later, in the write mode, the potential of the bias node BIAS_Node is a negative potential at the ground voltage Vss or lower than the ground voltage Vss. On the contrary, in the test mode, the potential of the bias node BIAS_Node becomes a potential close to the power voltage Vdd. In this manner, in the write mode, the P-type FET MP17 is turned into an on state, so that the power voltage Vdd is suppled to the P-type FETs MP10 and MP11 via the P-type FET MP17. On the contrary, in the test mode, as the P-type FET MP17 is turned into an off state, the node to which the P-type FETs MP10, MP11 and MP17 is at a high-impedance state.

Thus, in the write mode, in accordance with the logic value of the input data D[0], when the common bit line CBL is coupled to the power voltage Vdd for example, the common bit line /CBL is coupled to the bias node BIAS_Node. In this manner, in the write mode for example, the write circuit WCK becomes capable of supplying different potentials to the bit lines in a selected bit line pair (for example, BL[0] and /BL[0]) in accordance with the logic value of the input data D[0], so that it is able to write the input data D[0] to the memory cell.

The intermediate potential generating circuit IVG1 includes N-type FETs MN13 and MN14, the aforementioned wiring pair TL and /TL, the inverters IV4 to IV7, and inverters CIV1 and CIV2 which are capable of high-impedance output. The inverters CIV1 and CIV2 include control nodes nc and/nc. They are inverters in which, regardless of an input, an output is set into a high-impedance state by supplying a low level (high level) to the control node nc (/nc), and the input is inverted and outputted by supplying a high level (low level) to the control node nc (/nc). As such inverters CIV1 and CIV2, for example, clock inverters can be used.

In FIG. 4, the symbol MTC indicates a capacitance (wiring capacitance) formed between the wiring TL and the wiring /TL. In addition, in the N-type FET MN12, its source and drain are coupled to the wiring /TL and its gate is coupled to the wiring TL. In this manner, a MOS capacitance is composed by the N-type FET MN12 and the MOS capacitance is coupled between the wiring TL and the wiring /TL. In other words, in the first embodiment, between the wiring TL and the wiring /TL, two capacitative elements are coupled equivalently. Although the capacitative element has one pair of terminals, a terminal coupled to the wiring /TL can be regarded as one terminal of the capacitative element and a terminal coupled to the wiring TL can be regarded as the other terminal of the capacitative element.

In addition, the wiring /TL is coupled to a drain of the N-type FET MN13 and a source of the N-type FET MN13 is coupled to the ground voltage Vss The aforementioned bias node BIAS_Node is coupled to a connection node between the wiring /TL and the N-type FET MN13.

The inverters IV4 to IV7 and the inverters CIV1 and CIV2 configure a switching circuit for switching whether transferring a boost control signal BOOST to the wiring TL without inverting its logic value or transferring to the wiring TL with inverting its logic value. This switching is controlled by the bias mode control signal BIASMODE. In other words, the boost control signal BOOST is inverted by the inverter IV7 and the inverted boost control signal BOOST is supplied to the input of the inverter CIV2 and also supplied to the input of the inverter CIV1 via the inverter IV6. In this manner, an inverted boost control signal is supplied to the input of the inverter CIV2, and a control signal synchronized with the boost control signal BOOST is supplied to the input of the inverter CIV1.

The bias mode control signal BIASMODE is supplied to the control node nc of the inverter CIV1, and the bias mode control signal BIASMODE inverted by the inverter IV5 is supplied to the control node nc of the inverter CIV2. In this manner, in accordance with a level (logic value) of the bias mode control signal BIASMODE, an output of one of the inverters CIV1 and CIV2 is turned into a high impedance state and the other inverter inverts the input and outputs.

The outputs of the inverters CIV1 and CIV2 are supplied to the wiring TL via the inverter IV4. In the description below, a part of the wiring TL to which the gate of the N-type FET MN12 is coupled will be described as a boost node BOOST_Node. In addition, to a gate of the N-type FET MN13, the boost control signal BOOST inverted by the inverter IV7 is supplied.

To be described hereinafter, in the test mode, the N-type FET MN13 is turned into an off state. Here, by setting the bias mode control signal BIASMODE to a high level, along with an increase of the boost control signal BOOST, the boost node BOOST_Node is also increased towards the power voltage Vdd. Since the wiring TL and the wiring /TL are coupled by a capacitance (wiring capacitance MTC and MOS capacitance), the wiring /TL and the bias node BIAS_Node coupled to the wiring /TL are also increased to an extent that is slightly lower than the power voltage Vdd. Here, the bias node BIAS_Node is coupled to the bit line CBL or /CBL via the N-type FET MN8 or MN7 and a transfer gate in the unit column select circuit in accordance with the input data D[0].

Thus, by charge redistribution, a potential of a bit line to which the bias node BIAS_Node is lowered to a level lower than the pre-charged power voltage Vdd. That is, the potential of the bit line becomes an intermediate potential between the power voltage Vdd and the ground voltage Vss. In the test mode, the intermediate potential and the potential of the bit line shifted in accordance with a read current to flow in a selected memory cell are compared by the sense amplifier SA, so that a memory cell is decided.

In the first embodiment, a length of the wiring pair TL and /TL depends on a length of the bit line pair. In this manner, when the length of the bit line is changed according to the compiled SRAM technique, a capacitance value of the wiring capacitance MTC contributing to the charge redistribution in accordance with the change may be changed. In other words, the capacitance value of the wiring capacitance MTC is changed depending on the wiring length of the bit line. As a result, in the test mode, it is possible to reduce errors in decision of characteristics of the memory cell.

In addition, in the write mode, the intermediate potential generating circuit IVG1 functions as a part of the write circuit WCK. In the write mode, the bias mode control signal BIASMODE is set at a low level. When the boost control signal BOOST is changed from the ground voltage Vss to the power voltage Vdd, the potential of the boost node BOOST_Node is changed from the power voltage to the ground voltage Vss. Since there is a capacitance between the wiring TL and the wiring /TL, in accordance with a potential change of the boost node BOOST_Node, a potential of the bias node BIAS_Node is changed toward a negative potential (third voltage) that is lower than the ground voltage Vss. In this manner, in the write mode, to the bit line pair selected from the write circuit WCK, it is possible to supply the power voltage Vdd that is a positive voltage referring to the ground voltage Vss and a negative voltage referring to the ground voltage Vss, so that input data is surely written to a selected memory cell. That is, according to the first embodiment, it is possible to provide a write circuit having a function of assisting write with suppressing an increase of an occupied area.

Figures 5, 6:
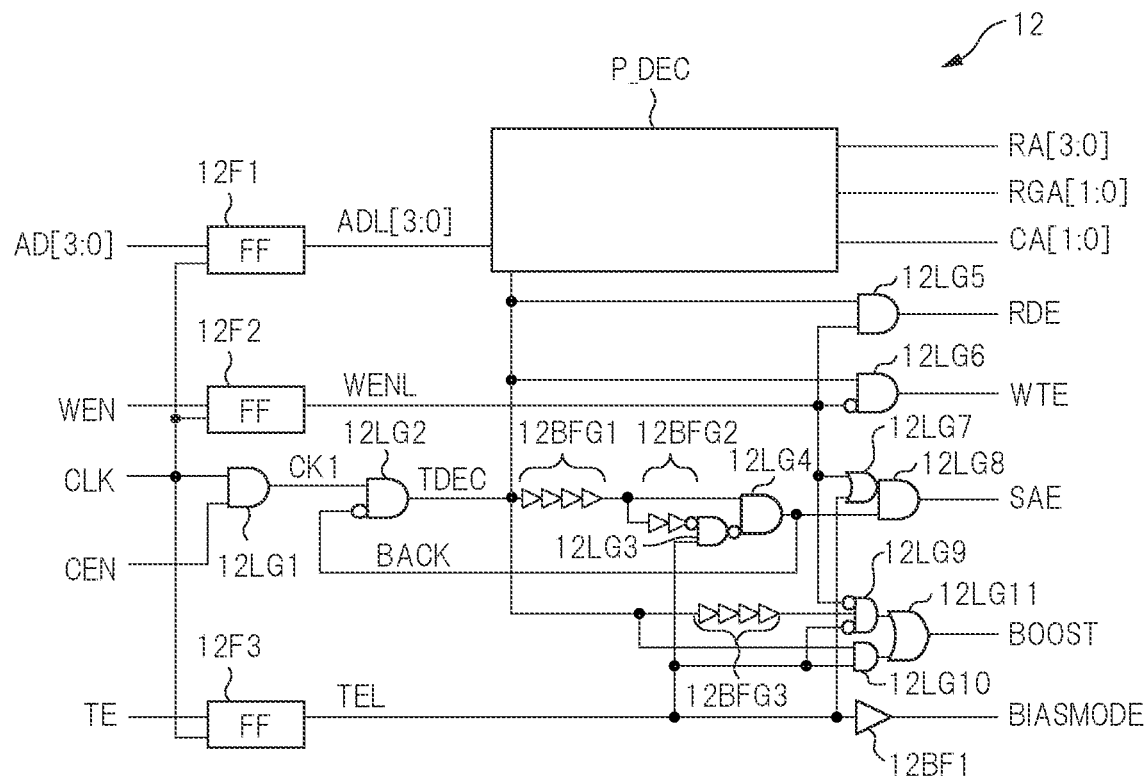
FIG. 5 is a diagram illustrating an operation of an intermediate potential generating circuit according to the first embodiment.
FIG. 6 is a diagram illustrating a configuration of a control circuit according to the first embodiment.

FIG. 5 is a diagram illustrating an operation of the intermediate potential generating circuit IVG1 according to the first embodiment. In FIG. 5, a relationship of the bias mode control signal BIASMODE, the boost control signal BOOST, the boost node BOOST_Node and the bias mode BIAS_Node is illustrated.

When the bias mode control signal BIASMODE has a logic value "1" and the boost control signal BOOST has a logic value "1", as described above, a potential of the boost node BOOST_Node is changed to the ground voltage Vss and the potential of the bias node BIAS_Node becomes an intermediate potential. In addition, when the bias mode control signal BIASMODE has a logic value "0" and the boost control signal BOOST has a logic value "1", as described above, a potential of the boost node BOOST_Node is changed to the ground voltage Vss and the potential of the bias node BIAS_Node becomes a negative potential.

On the contrary, when the bias mode control signal BIASMODE and the boost control signal BOOST both have a logic value "0", a potential of the boost node BOOST_Node is changed to the power voltage Vdd and the potential of the bias node BIAS_Node becomes the ground voltage Vss in accordance with the on state of the N-type FET MN13. In addition, when the bias mode control signal BIASMODE has a logic value "1" and the boost control signal BOOST has a logic value "0", potentials of the boost node BOOST_Node and the bias node BIAS_Node become the ground voltage Vss.

Configuration of Control Circuit and Column Select Circuit

Figure 7:
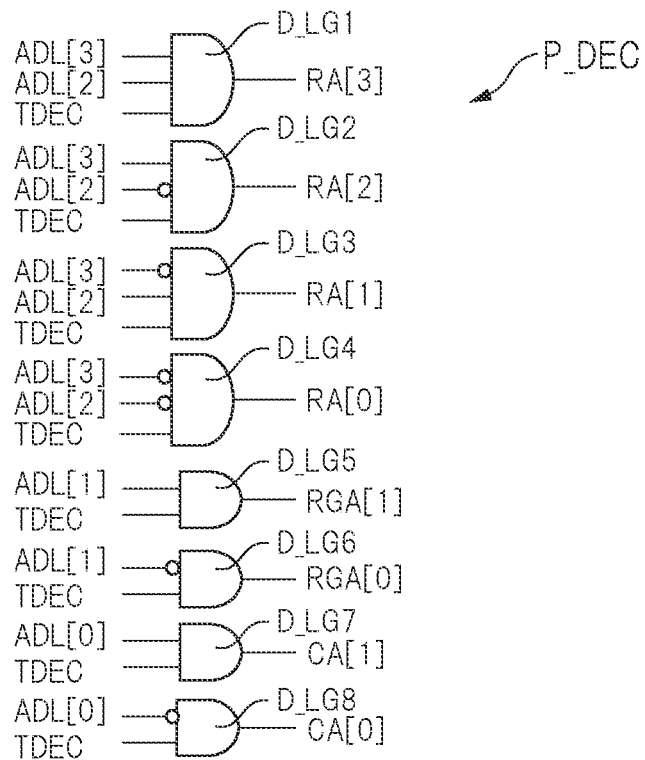
FIG. 7 is a diagram illustrating a configuration of the control circuit according to the first embodiment.
Figure 8:
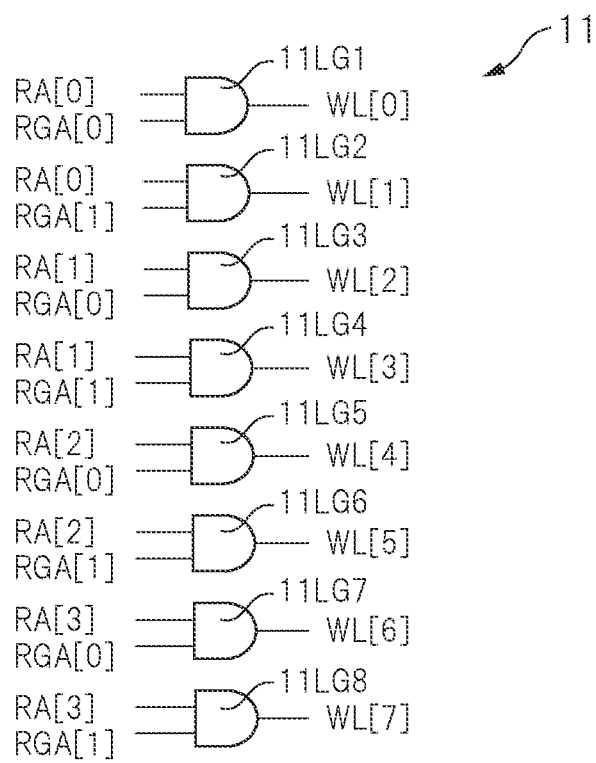
FIG. 8 is a diagram illustrating a configuration of a column selecting circuit according to the first embodiment.

Next, a configuration example of the column select circuit 11 and the control circuit 12 illustrated in FIG. 1 will be described. FIGS. 6 and 7 are block diagrams illustrating configurations of the control circuit according to the first embodiment. In addition, FIG. 8 is a block diagram illustrating a configuration of the column select circuit according to the first embodiment.

The control circuit 12 includes, as illustrated in FIG. 6, flip-flops 12F1 to 12F3, a buffer group (a plurality of buffers coupled in series) 12BFG1 to 12BFG3, logic gates 12LG1 to 12LG10, a buffer 12BF1, and a pre-decoder P_DEC.

The flip-flop 12F1 to 12F3 retrieve and retain an input and outputs in synchronization with the clock signal CLK. That is, the flip-flop 12F1 retrieves the address signal AD[3:0] and outputs the internal address signal ADL[3:0], and the flip-flop 12F2 retrieves the write enable signal WEN and outputs the internal write enable signal WENL. Also, the flip-flop 12F3 retrieves the test enable signal TE and outputs the internal test signal TEL.

To the logic gates (AND) 12LG1, the enable signal CEN and the clock signal CLK are supplied, and the logic gate 12LG1 outputs the internal enable signal CK1 synchronized with the clock signal CLK. The internal enable signal CK1 is supplied to the logical gate (AND) 12LG2 and the internal control signal TDEC is outputted from the logic gate 12LG2.

The internal control signal TDEC and the internal test signal TEL are supplied to a combination logic circuit configured by the buffer groups 12BFG1 and 12BFG2 and the logic gates 12LG3 and 12LG4, and an output signal of this combination logic circuit is supplied to the logic gate 12LG2 as an internal control signal BACK. The sense amplifier control signal SAE described above is formed by a combination logic circuit configured by the logic gates 12LG7 and 12LG8 based on the internal control signal BAK, the internal test signal TEL, and the internal write enable signal WENL.

The read control signal RDE described above is formed by the logic gate 12LG5 based on the internal control signal TDEC and the internal write enable signal WENL, and the write control signal WTE described above are formed by the logic gate 12LG6 by the logic gate 12LG6 based on the internal control signal TDEC and the internal write enable signal WENL.

The bias mode control signal BIASMODE described above is formed by the buffer 12BF1 based on the internal test signal TEL. In addition, the boost control signal BOOST described above is formed by a combination logic circuit configured by the buffer group 12BFG3 and the logic gates 12LG9 to 12LGl1 based on the internal test signal TEL, the internal control signal TDEC, and the internal write enable signal WENL.

The internal address signal ADL[3:0] and the internal control signal TDEC are supplied to the pre-decoder P_DEC. This pre-decoder P_DEC has, as illustrated in FIG. 7, the logic gates D_LG1 to D_LG8, and the row address signal RA[3:0], the column address signal CA[1:0] and the control signal RGA[1:0] (RGA[0] and RGA[1]) are formed by the logic gates D_LG1 to D_LG8 based on the internal address signal ADL[3:0] and the internal control signal TDEC.

In addition, the row select circuit 11 is configured by the logic gates 11LG1 to 11LG8 whose outputs are coupled to the word lines WL[0] to WL[7] as illustrated in FIG. 8 and supplies a high level to a word line specified by the row address signal RA[3:0] based on the row address signals RA[0] to RA[3] and the control signals RGA[0] and RGA[1].

Note that, in FIGS. 6 and 7, the circle put on the input side of the logical gates indicates logic inversion.

Operation Example of SRAM

Figure 9:
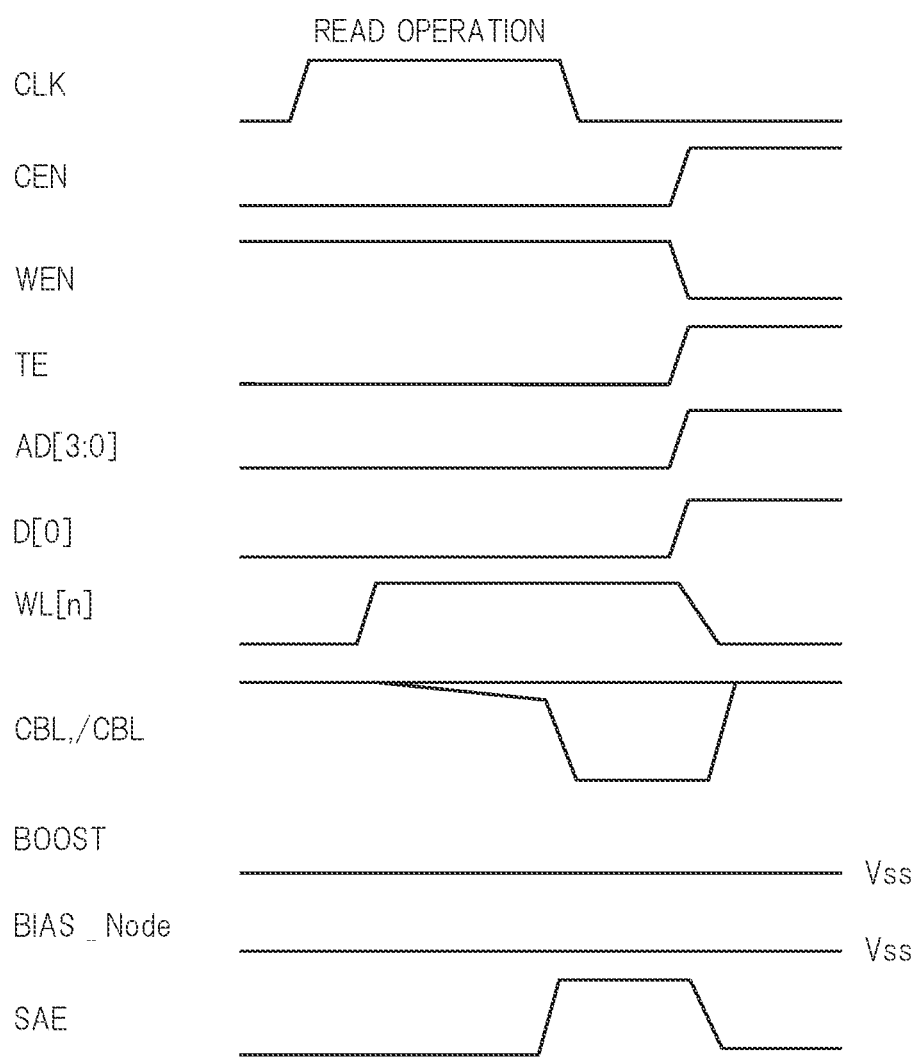
FIG. 9 is a waveform diagram illustrating an operation of the SRAM according to the first embodiment.
Figure 10:
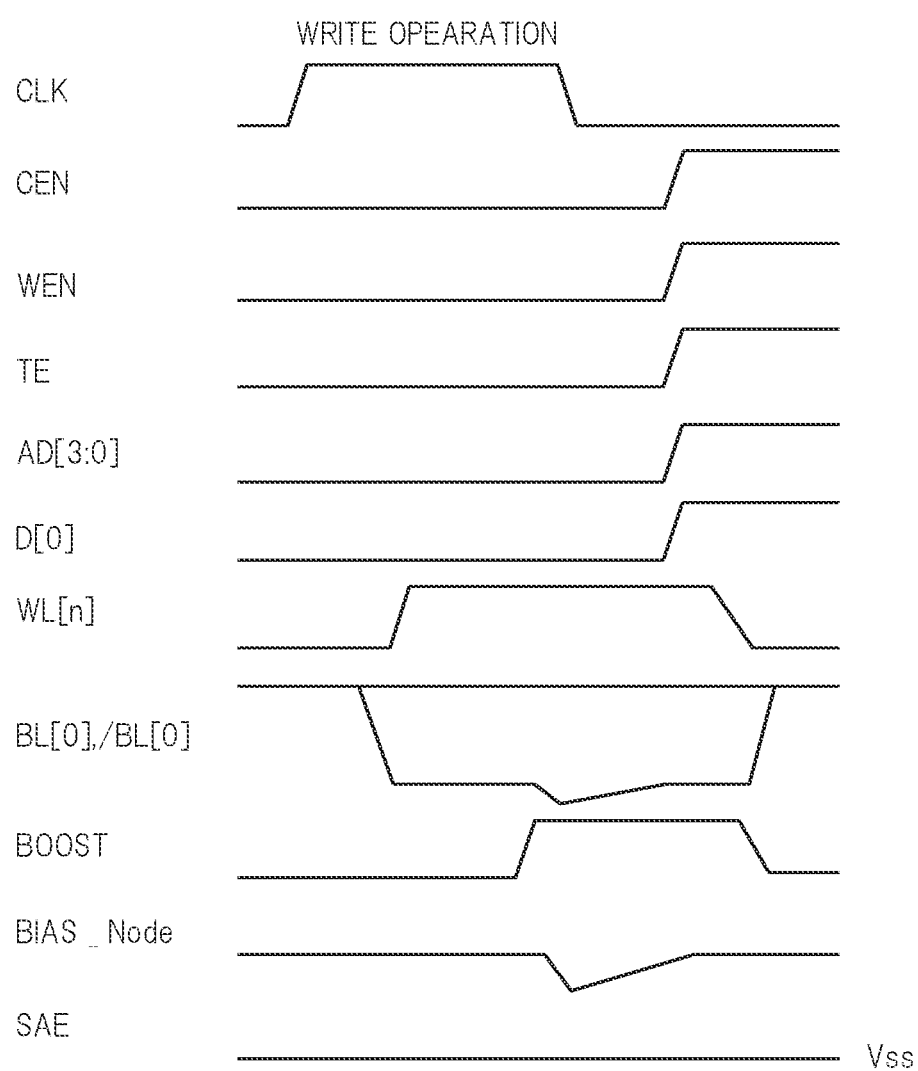
FIG. 10 is a waveform diagram illustrating an operation of the SRAM according to the first embodiment.
Figure 11:
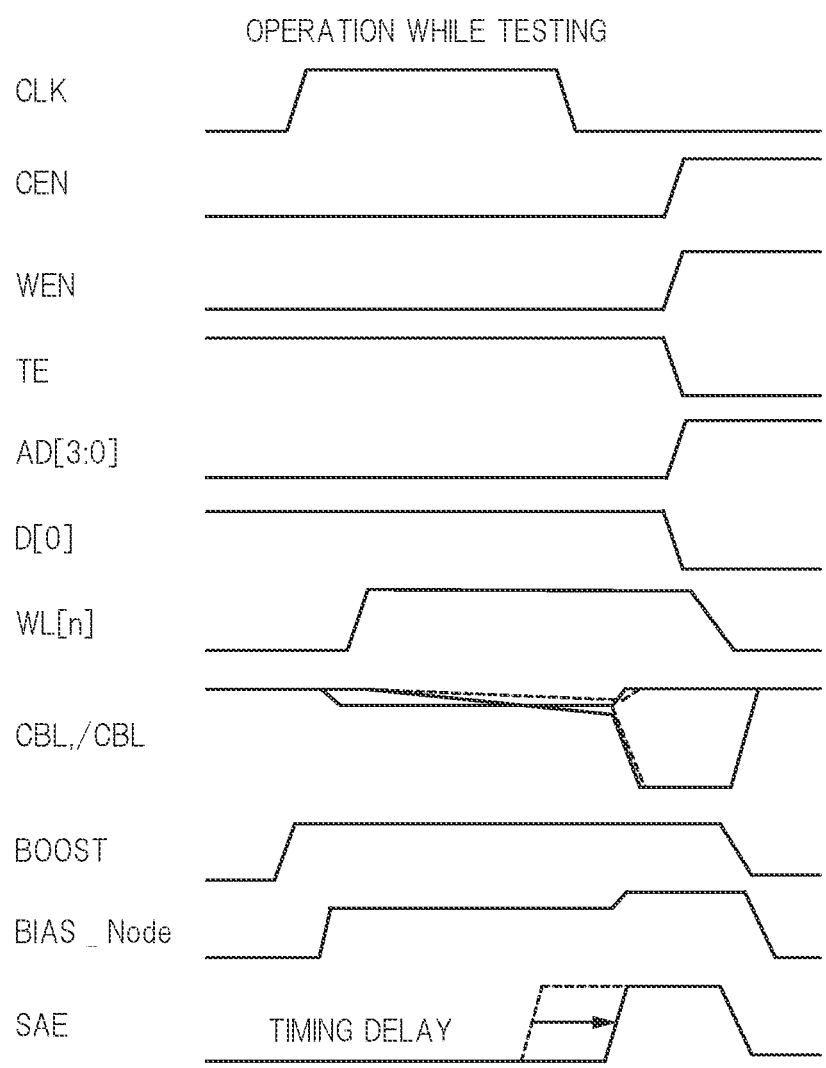
FIG. 11 is a waveform diagram illustrating an operation of the SRAM according to the first embodiment.

Next, operations of the SRAM according to the first embodiment will be described with reference to the drawings. FIGS. 9 to 11 are waveform diagrams illustrating operations of the SRAM according to the first embodiment. Note that, in the description below, FIGS. 3 to 6 illustrating configurations of the SRAM will be referred.

Read Operation

With reference to FIG. 9, Read operation in the read mode will be described. The operation of Read is instructed when the enable signal CEN is at a low level indicating an enable state, the write enable signal WEN is at a high level indicating read, and the test enable signal TE is at a low level which indicates that it is not in a test state. Here, the word line WL[n] and bit line pair BL[0] and /BL[0] are selected by the address signal AD[3:0].

As understood from the configuration of the control circuit 12 illustrated in FIG. 6 and FIG. 5, when the enable signal CEN and the test enable signal TE are set at a low level and the write enable signal WEN is set at a high level, the boost control signal BOOST and the bias mode control signal BIASMODE is set at a low level as illustrated in FIG.

9. In addition, as the sense amplifier control signal SAE is shifted from a low level to a high level with a delay determined mainly by the buffer group 12BFG1 after the clock signal CLK is changed because the test enable signal TE is at a low level and the internal test signal TEL illustrated in FIG. 6 is at a low level.

As the write enable signal WEN is set to a high level, the write control signal WTE is shifted to a low level. As a result, the N-type FETs MN5 and MN6 and the P-type FETs MP8 and MP9 configuring the transfer gate are turned into an off state, and the write circuit WCK is electrically separated from the common bit line pair CBL and /CBL.

To select the bit line pair BL[0] and /BL[0], the column address signal CA[0] is changed to a high level so that the N-type FETs MN3 and MN4 and the P-type FETs MP6 and MP7 configuring a transfer gate between the bit line pair BL[0] and /BL[0] and the common bit line pair CBL and /CBL are turned into an on state. Here, the P-type FETs MP3 to MP5 configuring the pre-charge circuit PCH1 coupled to the bit line pair BL[0] and /BL[0] in the same manner are turned into an off state. As a result, the pre-charge to a selected bit line pair is terminated and the selected bit line pair is coupled to a common bit line pair. In addition, in the Read operation, since the read control signal RDE is set to a high level, the pre-charge to the common bit line pair CBL and /CBL by the pre-charge circuit CH2 is also terminated.

According to a read current in a memory cell (selected memory cell) coupled to the selected word line WL[n] the selected bit line pair BL[0] and /BL[0], a potential of the bit line BL[0] or /BL[0] is gradually lowered from the pre-charged potential. In accordance with the potential lowering, a common bit line of any one of the common bit line pair CBL and /CBL coupled to the bit line pair BL[0] and /BL[0] via the transfer gate is gradually lowered from the pre-charged potential. In FIG. 9, the symbol CBL indicates a potential of the common bit line CBL and the symbol /CBL indicates a potential of the common bit line /CBL.

When the sense amplifier control signal SAE is set to a high level, the N-type FET MN11 is turned into an on state and the sense amplifier SA amplifies so that a potential difference between the common bit lines of the common bit line pair CBL and /CBL is increased. The latch circuit LTH retains the potential of the common bit line amplified by the sense amplifier as a logic value. The logic value retained in the larch circuit is read as the output data Q[0] from the inverter IV8.

Write Operation

With reference to FIG. 10, a Write operation in the write mode will be described. the operation of Write is instructed when the enable signal CEN is set to a low level, the write enable signal WEN is set to a low level indicating write, and the test enable signal TE is set to a low level. In the same manner as the Read operation, the word line WL[n] and the bit line pair BL[0] and /BL[0] are selected by the address signal AD[3:0].

Since the write enable signal WEN and the test enable signal TE are at a low level, as understood from the configuration of the control circuit 12 illustrated in FIG. 6, the sense amplifier control signal SAE is set to a low level as illustrated in FIG. 10. In addition, since the internal write enable signal WENL is set to a low level in response to the low level of the write enable signal WEN, the read control signal RDE is set to a high level, so that the pre-charge to the common bit line pair CBL and /CBL by the pre-charge circuit PCH2 is terminated. Here, pre-charge by the pre-charge circuit PCH1 to the selected bit line pair BL[0] and /BL[0] is also terminated in the same manner as the Read operation. In addition, the selected bit line pair BL[0] and /BL[0] are electrically coupled to the common bit line pair CBL and /CBL via the transfer gate in the same manner as the Read operation.

In the Write operation, in the same manner as the Read operation, the internal write enable signal WENL is set to a low level while the internal control signal TDEC is set to a high level, the write control signal WTE is set to a high level as understood from the configuration illustrated in FIG. 6. In this manner, the transfer gate configured by the N-type FETs MN5 and MN6 and the P-type FETs MP8 and MP9 is turned into an on state, so that the common bit line pair CBL and /CBL is electrically coupled to the write circuit via the transfer gate.

In the write circuit WCK, any one of the output signal CBW from the AND circuit LG1 and the output signal CTW from the AND circuit LG2 is set at a high level and the other one is set to a low level in accordance with the logic value of the input data D[0]. For example, when the input data D[0] has the logic value "1" (high level), the output signal CTW is set to a high level, so that the N-type FET MN9 is set to an on state and the P-type FET MP11 is set to an off state. Here, since the output signal CBW is set to a low level, the N-type FET MN7 is set to an off state and the P-type FET MP10 is set to an on state.

On the contrary, when the input data D[0] has the logic value "0" (low level), the output signal CTW is set to a low level, and the P-type FET MP11 is set to an on state and the N-type FET MN is set to an off state. Here, since the output signal CBW is set to a high level, the N-type FET MN7 is set to an on state and the P-type FET MP10 is set to an off state.

In this manner, the common bit line CBL corresponding to the output signal CTW and the selected bit line BL[0] are coupled to the bias node BIAS_Node via the N-type FET MN8 when the input data D[0] has a logic value of "1", and coupled to the power voltage Vdd via the P-type FET MP11 when the input data D[0] has a low-level logic value of "0".

In the same manner, the N-type FET MN7 is set to an on state when the input data D[0] has a logic value of "0", and the common bit line /CBL and the selected bit line /BL are coupled to the bias node BIAS_Node. When the input data D[0] has a logic value of "1", the common bit line /CBL and the selected bit line /BL are coupled to the power voltage Vdd.

The bias mode control signal BIASMODE is set to a low level because the test enable signal TE is at a low level, and the boost control signal BOOST is changed from a low level to a high level after the internal control signal TDEC is changed to a high level in accordance with a change of the clock signal CLK, mainly after a time period determined by the buffer group 12BFG. As illustrated in FIG. 5, when the bias mode control signal BIASMODE is set to a low level (logic value "0") and the boost control signal BOOST is changed to a high level (logic level "1"), the potential of the bias node BIAS_Node is raised to a negative voltage.

Therefore, the power voltage Vdd and a negative voltage are supplied to the bit line pair BL[0] and /BL[0] in accordance with the logic value of the input data D[0]. For example, when the input data D[0] has a logic value of "1", a negative potential is supplied to the bit line BL[0] and a power voltage Vdd is supplied to the bit line /BL[0]. In this manner, a large potential difference in accordance with the input data D[0] is provided to a selected memory cell, so that it is possible to surely write the input data D[0] to the memory cell, for example.

Test Operation

With reference to FIG. 11, a test operation in the test mode will be described. The operation of test is instructed when the enable signal CEN is set to a low level, the write enable signal WEN is at a low level, and the test enable signal TE is at a high level.

Again, in the same manner as the Read operation and Write operation, the word line WL[n] and the bit line pair BL[0] and /BL[0] are selected by the address signal AD[3:0]. That is, a case in which a test of a selected memory cell that is coupled to the word line WL[n] and bit line pair BL[0] and /BL[0] is performed will be described as an example.

When the test enable signal TE is changed from the low level to the high level, the bias mode control signal BIASMODE is also changed from a low level to a high level. In this manner, in the control circuit 12 illustrated in FIG. 6, an output of the logic gate 12LG10 is changed from a low level to a high level, and the boost control signal BOOST is also changed from a low level to a high level. In this manner, an intermediate potential occurs at the bias node BIAS_Node as illustrated in FIG. 5.

The transfer gate between the selected bit line pair BL[0] and /BL[0] and the common bit line pair CBL and /CBL is set at an on state. Therefore, the bit line pair BL[0] and /BL[0] are electrically connected to the common bit line pair CBL and /CBL/.

In the example illustrated in FIG. 11, the input data D[0] is set at a high level (logic value "1"). Also, because the write control signal WTE is at a high level, the output signal CTW of the AND circuit LG2 is set at a high level, so that the N-type FET MN8 is set at an on state. As a result, the bias node BIAS_Node is electrically coupled to the common bit line CBL via the N-type FET MN8 and charge redistribution is performed among the wiring /TL, the bias node BIAS_Node, the common bit line CBL and the bit line BL[0], a potential of the bit line BL[0] and the common bit line CBL is slightly lowered from the pre-charged potential (Vdd). In FIG. 11, a change in the potential of the common bit line CBL is illustrated by a dotted line.

In the Write operation described in FIG. 10, when a logic value of "0" is supplied as the input data D[0], the bit line BL[0] is set to a high level, so that data of a logic value "0" which sets the bit line /BL[0] at a low level is written to the selected memory cell. In a case in which the input data D[0] having a logic value of "0" has been written, as long as the selected memory cell is normal, the word line WL[n] is selected in the test operation, so that the potential of the bit line /BL[0] is gradually lowered from the pre-charged potential (Vdd). At a timing at which the sense amplifier control signal SAE is changed to a high level, the potential of the bit line /BL[0] becomes lower than the potential of the bit line BL[0], and also the potential of the common bit line /CBL becomes lower than the potential of the common bit line CBL. As a result, as the output data Q[0], a logic value "0" of low level is outputted and it can be determined that the selected memory is normal and the test is passed.

On the contrary, when a read current of a memory cell that is an object of the test, i.e., a selected memory cell is small for example due to problems and so forth in a process of manufacturing the semiconductor device 1, a timing of lowering from the pre-charged potential of the potential of the bit line /BL[0] is delayed. At a timing at which the sense amplifier control signal SAE is changed to a high level, the potential of the bit line /BL[0] is not sufficiently lowered and it does not be lower than the potential of the bit line BL[0]. As a result, the potential of the common bit line /CBL does not be lower than that of the common bit line CBL, so that a high level of logic value "1" is outputted as the output data Q[0]. In this manner, an error in expectation value occurs in the selected memory cell and a problem of the object tell can be detected.

Here, a case in which the logic value "0" is written as an expectation value to the object memory cell has been described. However, the same goes for a case in which a logic value "1" is written in the object memory cell. In other words, in the case of logic value "1", data of the logic value "1" such as that the data sets the bit line BL[0] to a low level and the bit line /BL[0] to a high level is written in the selected memory cell. In this case, in the test operation, a low level (logic value "0") is supplied as the input data D[0]. In this manner, the output signal CBW of the logic gate LG1 is set to a high level, and a pre-charge among the wiring /TL, the bias node BIAS_Node, the common bit line /CBL, and the bit line /BL[0] is performed, so that the potential of the bit line /BL[0] and the common bit line /CBL is gradually lowered from a pre-charged potential Vdd. When the object cell is normal, the output data Q[0] has a logic value that is the same as expectation value "1" previously written, and when there is any problem in the memory cell, the output data Q[0] has a logic value "0" that is different from the expectation value "1".

As described above, in the first embodiment, a logic value in an opposite phase (inverted) to a logic value written in an object memory cell (logic value that is an expectation value) is supplied as input data in the test operation.

Further, in the SRAM according to the first embodiment, in the test operation, as compared to the Read operation, the timing at which the sense amplifier control signal SAE is changed from the low level to the high level is set to be delayed. In the first embodiment, the setting of the delay of the sense amplifier control circuit SAE is achieved mainly by the logic gate 12LG3 and the buffer group 12BFG2 illustrated in the control circuit 12 in FIG. 6. That is, after the internal test signal TEL is set to a high level, the internal control signal TDEC which has been delayed by the buffer group 12BFG2 is supplied to an invert input of the logic gate 12LG3, so that the sense amplifier control signal SAE is changed to a high level. Therefore, by changing the number of buffers configuring the buffer group 12BFG2 for example, it is possible to change the timing of rising of the sense amplifier control signal SAE. Although it will be described with reference to FIGS. 2 and 3, by delaying a timing of activating the sense amplifier SA by the sense amplifier control signal SAE, determination of whether the read current that flows in the object memory cell is small or not can be ensured better.

Note that, by changing the sense amplifier control signal SAE to a high level, the sense amplifier SA is activated and thus, as illustrated in FIG. 11, a potential difference between the common bit lines of the common bit line pair is increased in accordance with the amplification by the sense amplifier SA, the potential of the bias node BIAS_Node is increased.

The N-type FETs MN7 and MN8 and the P-type FETs MP10 and MP11 configure a circuit for supplying a voltage following data to be written in the memory cell MC to a selected bit line pair. On the contrary, in the test operation, the N-type FETs MN7 and MN8 and the P-type FETs MP10 and MP11 are operated as specifying circuits which specifies a bit line to which the wiring capacitance MTC is coupled to couple the specified bit line to the wiring capacitance MTC.

Memory Cell

Figure 12:
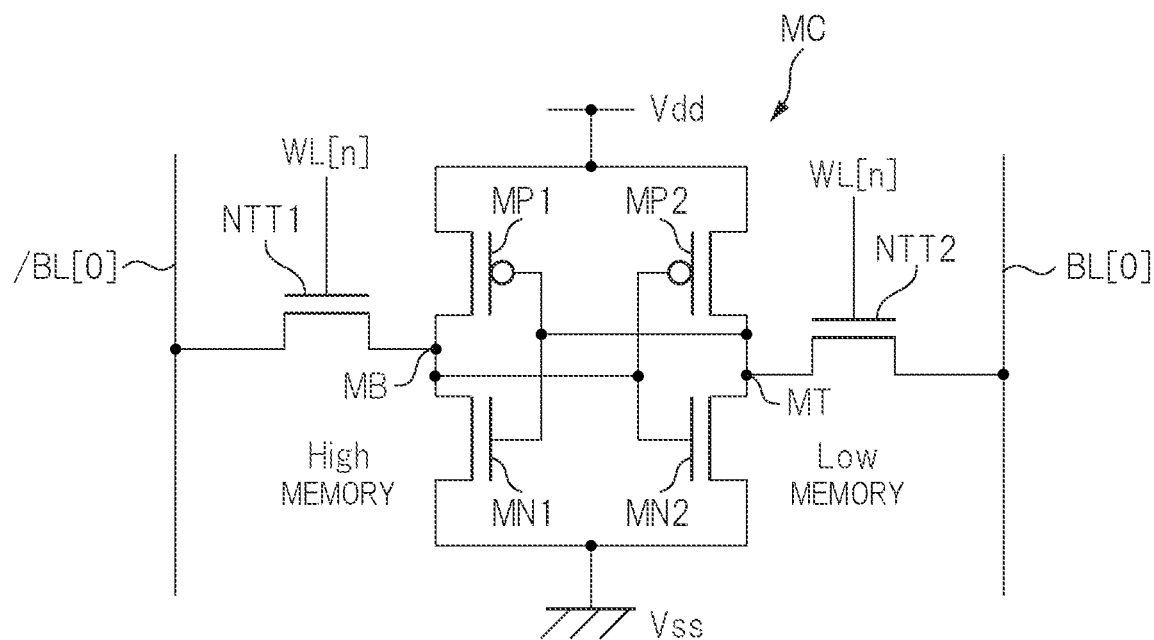
FIG. 12 is a circuit diagram illustrating a configuration of a memory cell according to the first embodiment.

FIG. 12 is a circuit diagram illustrating a configuration of the memory cell according to the first embodiment. In addition, FIG. 13 is a waveform diagram illustrating an operation of the memory cell in the test operation.

In FIG. 12, a state of the memory cell MC in which a logic value "0" has been written is illustrated. In other words, the memory cell MC retains such data to set the bit line /BL[0] to a high level and the bit line BL[0] to a low level when the word line WL[n] is selected. In this state, the N-type FET MN1 and the P-type FET MP2 are in an off state and the N-type FET MN2 and the P-type FET MP1 are in an on state. Thus, a node MT is at to a low level so that Low is memorized, and a node MB is set to a high level so that High is memorized.

Figure 13:
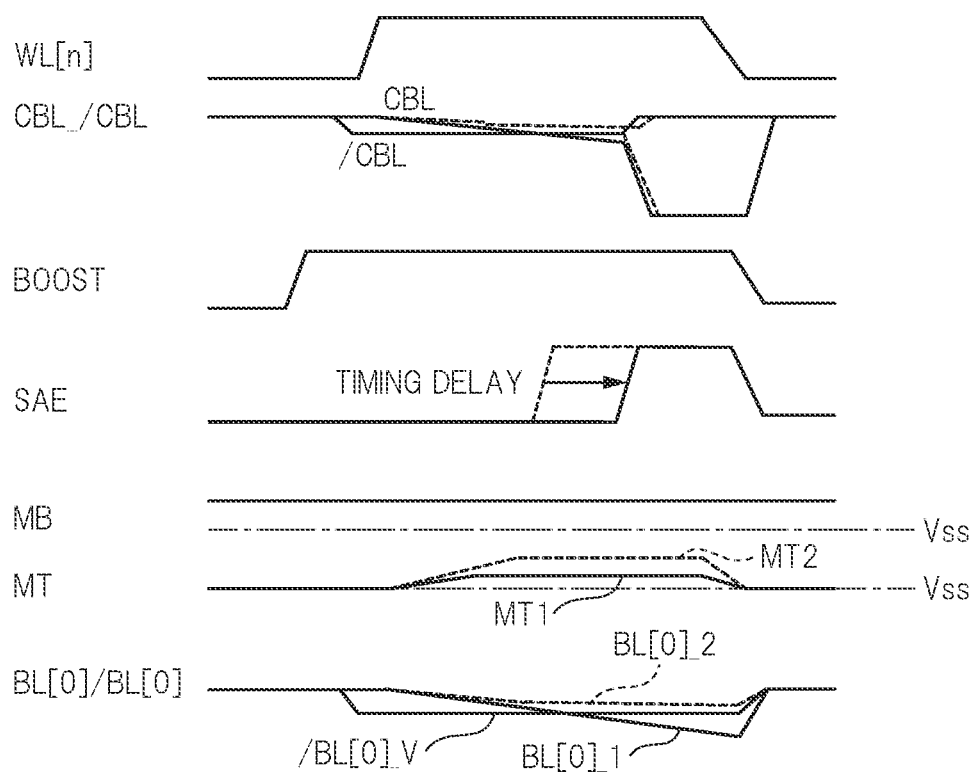
FIG. 13 is a waveform diagram illustrating an operation of the memory cell in a test mode.

When the memory cell MC is normal, the word line WL[n] is at a high level, and a potential of the node MT is changed as illustrated in FIG. 13 by a solid line MT1 by a read current which flows in the memory cell MC even when the node MT is electrically coupled to the bit line BL[0] via the N-type FET NTT2. In other words, it is possible to prevent a large floating of the potential of the node MT from the ground voltage Vss due to the read current. In this manner, the potential of the bit line BL[0] is changed like a solid line BL[0]_1. On the contrary, when the read current which flows in the memory cell MC is small due to problems in a process and so forth, the capacity of suppressing the potential of the node MT is lowered and it lets the potential of the node MT largely float from the ground voltage Vss as illustrated by a broken line MT2. In this manner, the potential of the bit line BL[0] is changed like a broken line BL[0]_2.

In FIG. 13, the symbol /BL[0]_V indicates a potential of the bit line /BL[0]. As understood from FIG. 13, after the word line WL[n] is changed to a high level, as a sufficient time period has passed, it is possible to increase a potential difference between the potential /BL[0]_V of the bit line /BL[0] and the potential BL[0]_2 of the bit line BL[0]. Thus, in the first embodiment, in the test operation, the timing to activate the sense amplifier SA is set to be delayed as compared to that in the Read operation.

DFT Control Block

Figure 14:
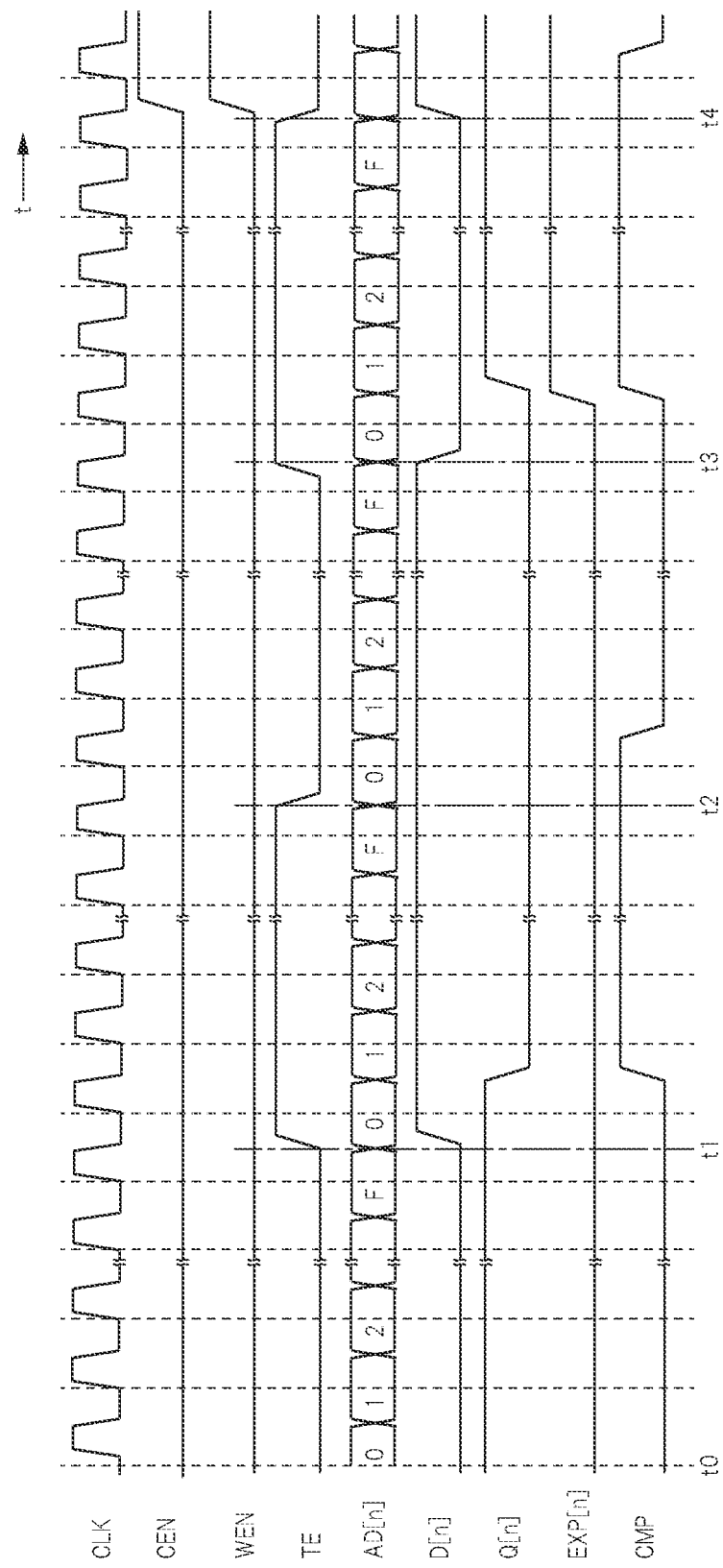
FIG. 14 is a waveform diagram illustrating an operation of a DFT control block according to the first embodiment.

The DFT control block illustrated in FIG. 1 outputs a signal for testing and data etc. to the SRAM. FIG. 14 is a waveform diagram illustrating an operation of the DFT control block according to the first embodiment.

The DFT control block 6 writes a logic value "0" as an expectation value to all of the memory cells in the SRAM or example, and then tests all of the memory cells with supplying a logic value "1" that is an inverted logic value to the expectation value as the input data D[n]. Then, setting the logic value "1" as an expectation value, write is performed to all of the memory cells to test all of the memory cell with supplying a logic value "0" as input data.

To describe with reference to FIG. 14, between the time t0 to t1, a logic value "0" is written as the input data D[n] to all of the memory cells of addresses 0 (zero) to F with changing the address signal AD[n]. During the next time period from t1 to t2, the test enable signal TE is set to a high level to set the SRAM to the test mode. In the test mode, the DFT control block 6 supplies a logic value "1" as input data D[n] to the SRAM with changing the address signal AD[n]. In the test mode, when the output data Q[n] is a logic value "0", the DFT control block 6 determines that the object memory passes the test. On the contrary, when the output data Q[n] has a logic value "1", the DFT control block 6 determines that the object memory cell fails in the test.

Next, also in a time period from t2 to t3, with changing the address signal AD[n], to all of the memory cells of the addresses 0 (zero) to F, a logic value "1" is written as input data D[n]. Between the next time period from t3 to t4, the test enable signal TE is set to a high level to set the SRAM in the test mode. In the test mode, the DFT control block 6 supplies a logic value "0" to the SRAM as input data D[n]. In the test mode, when the output data Q[n] is logic value "1", the DFT control block 6 determines that the object memory cell passes the test. On the contrary, when the output data Q[n] is a logic value "0", the DFT control block 6 determines that the object memory cell fails in the test.

In the first embodiment, to each of the SRAMs 2S1 to 5S1 (FIG. 1), the wiring pair Tl and /TL is provided. A wiring length of the wiring pai TL and /TL in each of the SRAMs 2S1 to 551 is the same as that of the bit line pair of the SRAM in which the wiring pair TL and /TL is provided (corresponding STAM). In this manner, in the test mode, a value of a wiring capacitance which is coupled to a bit line in the test mode can be suitably set per SRAM, and it is possible to surely detect a defective memory cell in the test mode. That is, according to the compiled SRAM technique, even when various types of SRAMs are provided in a semiconductor device, it is possible to surely detect a defective memory cell.

Second Embodiment

Figure 15:
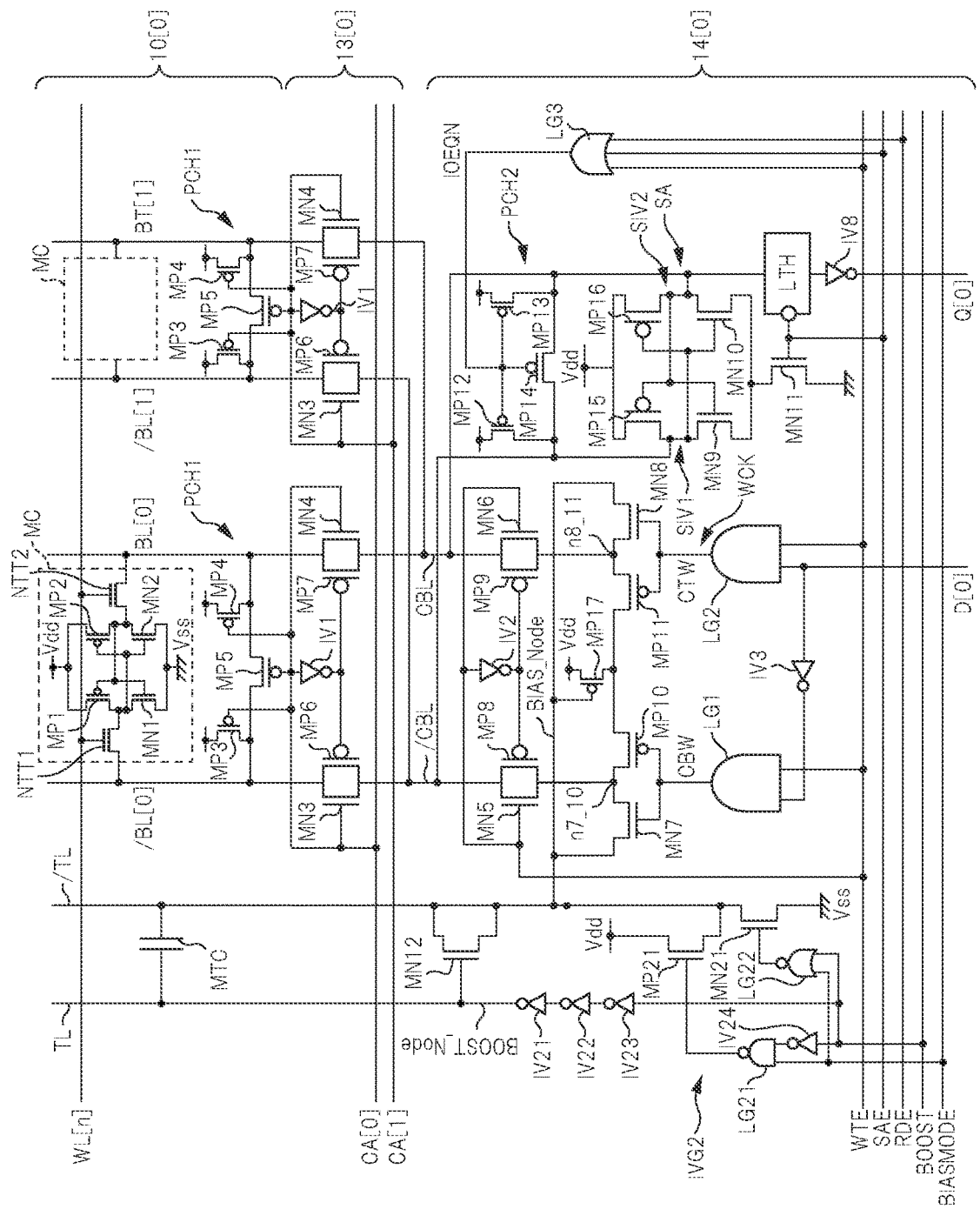
FIG. 15 is a circuit diagram illustrating a configuration of a unit memory array, a unit column select circuit and a unit IO control circuit according to a second embodiment.

FIG. 15 is a circuit diagram illustrating a configuration of a unit memory array, a unit column select circuit, and a unit IO control circuit. FIG. 15 is similar to FIG. 4. A different point is the intermediate potential generating circuit that is changed to an intermediate potential generating circuit IVG2.

The intermediate potential generating circuit IVG2 includes inverters IV21 to IV24, an N-type FET MN21, a P-type FET MP21, a NAND circuit LG21, a NOR circuit LG22, a wiring pair TL and /TL and an N-type FET MN12 configuring a MOS capacitance.

FIG. 16 is a diagram illustrating an operation of the intermediate potential generating circuit according to a second embodiment.

In a Write operation, a bias mode control signal BIAS-MODE has a logic value "0" and a boost control signal BOOST is changed from a logic value "0" to a logic value "1" by activation. In addition, in a test operation, a bias mode control signal BIASMODE has a logic value "1" and a boost control signal BOOST is changed from a logic value "0" to a logic value "1" by activation.

In a Read operation, when the boost control signal BOOST has a logic value "0", the boost node BOOST_Node is at a power voltage Vdd and the bias node BIAS_Node is at a ground voltage Vss. From this state, the boost control signal BOOST is changed (activated) from the ground voltage Vss to the power voltage Vdd, the boost node BOOST_Node is changed to the ground voltage Vss and the bias node BIAS Node is set at a negative potential. That is, in the same manner as the first embodiment, in the Write operation, it is possible to supply a negative potential to a bit line.

In addition, in the test operation, when the boost control signal BOOST has a logic value "0", the boost node BOOST_Node is set to the power voltage Vdd and the bias node BIAS_Node is set to the power voltage Vdd different from the first embodiment. From this state, when the boost control signal BOOST is changed (activated) from the ground voltage Vss to the power voltage Vdd, the boost node BOOST_Node is capable of generating an intermediate potential slightly lower than the power voltage Vdd. In this manner, in the same manner as the first embodiment, in the test mode, a potential of a reference bit line can be changed to a potential that is slightly lower than the pre-charged power voltage Vdd. As a result, in the same manner as the first embodiment, a defective memory cell can be detected.

In FIG. 4 and FIG. 15, the intermediate potential generating circuits IVG1 and IVG2 can be regarded to include the wiring pair TL and /TL and an intermediate potential control circuit coupled to the wiring pair TL and /TL and supplying a voltage corresponding to a mode (Write mode, test mode). In view of this, the intermediate potential control circuit specifies a mode by the bias mode control signal BIAS-MODE as illustrated in FIGS. 5 and 16. In addition, the intermediate control circuit changes the voltage of the wiring TL (boost node BOOST_Node) corresponding to a specified mode in accordance with a change in the boost control signal BOOST.

While the invention made by the inventors of the present invention has been described specifically based on the embodiment, the present invention is not limited to the embodiment and it is needless to say that the invention can be variously modified within the scope of the invention. For example, the wiring length of the wiring pair TL and /TL may be not substantially same as that of the bit line pair BL[0] and /BL[0] and it may depend on a length of a bit line pair.

What is claimed is:

1. A semiconductor device comprising:
   a memory cell;
   a bit line pair on which a voltage is changed towards a first voltage and a second voltage that is different from the first voltage in a read mode in accordance with data of the memory cell, the bit line pair being coupled to the memory cell; and
   a write circuit for supplying a potential in accordance with data to be written to the bit line pair in a write mode,
   wherein the write circuit includes a specifying circuit for specifying a bit line out of the bit line pair in accordance with the data to be written,
   wherein the write circuit supplies a third voltage that is different from the first voltage and the second voltage to the bit line specified by the specifying circuit in the write mode,
   wherein a capacitative element is coupled to the bit line specified by the specifying circuit and a voltage of the specified bit line is set to a voltage between the first voltage and the second voltage in a test mode, and
   wherein the capacitative element has a wiring capacitance that is determined depending on a length of the bit line pair.

2. The semiconductor device according to claim 1, wherein the first voltage is a positive voltage based on the second voltage and the third voltage is a negative voltage based on the second voltage.

3. The semiconductor device according to claim 1,
   wherein the capacitative element includes one terminal to be coupled to the bit line specified by the specifying circuit and another terminal to which a voltage corresponding to a mode is supplied,
   the voltage of the another terminal of the capacitative element is changed to the second voltage from the first voltage in the write mode, and
   the voltage of the another terminal of the capacitative element is changed to the first voltage from the second voltage.

4. The semiconductor device according to claim 3, further comprising
   a sense amplifier for amplifying a potential difference between the bit lines of the bit line pair in the read mode and the test mode,
   wherein an operation of the sense amplifier is started with a delay more in the test mode than in the read mode.

5. The semiconductor device according to claim 2,
   wherein the capacitative element has a length depending on the length of the bit line pair, the capacitative element including the wiring capacitance formed by a wiring pair extended in a direction same as that of the bit line pair, and a MOS capacitor coupled between the wirings of the wiring pair,
   one of the wirings of the wiring pair is coupled to the bit line specified by the specifying circuit,
   an intermediate potential control circuit for supplying a voltage in accordance with a mode is coupled to the other wiring out of the wiring pair, and
   the intermediate potential control circuit supplies a voltage changed to the first voltage from the second voltage to the other wiring in the test mode.

6. The semiconductor device according to claim 5, wherein the intermediate potential control circuit supplies a voltage changed to the second voltage from the first voltage to the other wiring in the write mode.

7. The semiconductor device according to claim 1, further comprising a DFT control circuit for generating a signal which is used in the test mode,
   wherein, in the test mode, the DFT control circuit applies data that has an opposite logic level to that of the data in the write mode.

* * * * *